United States Patent [19]

Tanaka

[11] Patent Number: 4,749,951
[45] Date of Patent: Jun. 7, 1988

[54] LOW-PASS FILTER CIRCUIT WITH VARIABLE TIME CONSTANT

[75] Inventor: Yasushi Tanaka, Nagaokakyo, Japan

[73] Assignee: Mitsubishi Denki Kabushiki Kaisha, Tokyo, Japan

[21] Appl. No.: 736,751

[22] Filed: May 21, 1985

[30] Foreign Application Priority Data

Jun. 13, 1984 [JP] Japan .................................. 59-124094
Aug. 20, 1984 [JP] Japan .................................. 59-174545

[51] Int. Cl.⁴ .......................... H03K 5/00; H03K 5/08
[52] U.S. Cl. .................................... 328/167; 307/542;
307/551; 307/520; 328/171
[58] Field of Search ............... 328/167, 169, 171, 150;
307/542, 543, 547, 551, 546, 360, 520, 521

[56] References Cited

U.S. PATENT DOCUMENTS

| 3,173,095 | 3/1965 | Wagner | 307/546 |
| 3,390,341 | 6/1968 | Kline | 328/171 |
| 3,524,081 | 8/1970 | Campanella | 307/543 |
| 3,755,750 | 8/1973 | Heberling | 328/167 |
| 3,895,305 | 7/1975 | Longman, Jr. | 328/167 |
| 4,204,170 | 5/1980 | Kage | 307/551 |
| 4,219,745 | 8/1980 | Hersman | 328/167 |

Primary Examiner—Stanley D. Miller
Assistant Examiner—Timothy P. Callahan
Attorney, Agent, or Firm—Lowe, Price, LeBlanc, Becker & Shur

[57] ABSTRACT

A low-pass filter circuit comprises a low-pass filter including a series connection of first and second resistors and having one end connected to an input terminal and a capacitor connected between the other end of the series connection and the ground, a phase inverting amplifier having an input connected to the other end of the series connection, a feed back circuit connected between the input and output of the phase inverting amplifier and having a predetermined time constant, and a diode connected in parallel with the first resistor. The diode may be connected, with the cathode connected to the input terminal, so that the electric charge of the feed back circuit may be discharged. Alternatively, the diode may be connected, with the anode connected to the input terminal, so that the electric charge may be charged to the feed back circuit. Alternatively, two diodes may be connected in parallel with the first resistor, with the cathode of one of the diodes connected to the input terminal while with the anode of the other of the diodes connected to the input terminal.

13 Claims, 3 Drawing Sheets

LOW-PASS FILTER CIRCUIT WITH VARIABLE TIME CONSTANT

BACKGROUND OF THE INVENTION

1. Field of the Invention

The present invention relates to a low-pass filter circuit. More specifically, the present invention relates to a low-pass filter circuit for use in a system for controlling a tuning apparatus employing a phase locked loop.

2. Description of the Prior Art

FIG. 1 shows a block diagram of a system for controlling a tuning apparatus employing a phase locked loop. Referring to FIG. 1, the system comprises a receiving antenna 1, a high frequency amplifier 2 coupled to the antenna 1, and a local oscillator 3 coupled to the high frequency amplifier 2. The local oscillator 3 comprises a tuning circuit including a coil and a voltage controlled variable capacitance device 12. Such a voltage controlled variable capacitance device may comprise a voltage controlled variable capacitance diode which is commercially available as referred to as "Varicap cap". The voltage controlled variable capacitance device 12 is connected to receive an output of a low-pass filter circuit 4. The input of the low-pass filter circuit 4 is connected from a phase comparator 5. The phase comparator 5 is connected to receive one input from a reference frequency signal terminal 11 and the other input from a programmable frequency divider 7. The programmable frequency divider 7 is connected to receive a frequency signal to be divided from a prescaler 8 and a frequency division ratio controlling signal from a central processing unit 6. The prescaler 8 comprises a frequency divider for frequency dividing the output from the local oscillator 3. Thus, the local oscillator 3, the prescaler 8, the programmable frequency divider 7, the phase comparator 5 and the low-pass filter 4 constitute a phase locked loop, as is well known. The frequency converted output obtained from the local oscillator 3 is supplied to a television signal processing circuit 9 and the output from the television signal processing circuit is supplied to a picture tube 10, which may comprise a cathode ray tube.

An oscillation output from the local oscillator 3 is first frequency divided by the prescaler 8 and the frequency divided output thus obtained from the prescaler 8 is supplied to the programmable frequency divider 7. The programmable frequency divider 7 serves to frequency divide the output from the prescaler 8 as a function of the data supplied from the central processing unit 6. The phase comparator 5 compares the phases of the frequency divided output from the programmable frequency divider 7 and the reference frequency signal from the output frequency signal terminal 11, whereupon the outout signal is supplied to the low-pass filter circuit 4. The output from the low-pass filter circuit 4 is supplied, as a tuning voltage, to the voltage controlled variable capacitance device 12 included in the local oscillator 3. As a result, the oscillation frequency of the local oscillator 3 is controlled to be a value determined by the data obtained from the central processing unit 6.

FIG. 2 is a schematic diagram of one example of a conventional low-pass filter circuit 4 for use in the system shown in FIG. 1. The low-pass filter circuit 4 shown in FIG. 2 comprises a resistor 13 having one input connected to an input terminal IN for receiving an input voltage Ei and the other end connected to an input 15a of a phase inverting amplifier 15 operable to be switchable and having a high input impedance, and a capacitor 14 coupled between the other end of the resistor 13 and the ground. The resistor 13 and the capacitor 14 constitute a low-pass filter. The inverting amplifying circuit 15 has the input 15a thereof connected to the other end of the resistor 13 and to the non-grounded end of the capacitor 14, while the output 15b of the inverting amplifier is connected to the output terminal OUT. The phase inverting amplifier 15 is shunted by a feedback circuit 16 having a predetermined time constant. The feedback circuit is coupled between the input 15a and the output 15b of the amplifier and further has a load resistor 17 coupled to the output 15b of the amplifier 15. The input voltage supplied to the input terminal IN is denoted as Ei and the output voltage appearing at the output terminal OUT is denoted as Eo.

In operation, a response rate in which the output voltage Eo is switched from a lower voltage to a higher voltage as a function of the data supplied from the central processing unit 6 and thus a function of the input voltage Ei supplied from the input terminal IN, is substantially determined by the time constant set in the feedback circuit 16. Therefore, in case where the time constant of the feedback circuit 16 is decreased to increase the response rate, a ripple component included in the output voltage Eo appearing at the output terminal OUT is increased, which adversely affects a reception state where the output terminal OUT is to be brought to a constant potential, referenced hereinafter as a normal or first reception state. On the other hand, in case where the time constant of the feedback circuit 16 is increased to decrease the response rate, while the ripple of the output voltage is decreased and any problem on the occasion of normal reception is eliminated, a disadvantage is caused on the occasion of transition in reception where the output potential appearing at the output terminal OUT is changed.

In order to solve such dilemma, a conventional approach was to employ a value of the time constant of the feedback circuit which is determined as a compromise of the above described two requirements. As a result, there existed limits in simultaneously increasing a response rate and decreasing a ripple.

SUMMARY OF THE INVENTION

Accordingly, a principal object of the present invention is to provide a low-pass filter circuit wherein a response rate increases when an output voltage changes at an output terminal from a low voltage to a high voltage is increased while a ripple in an output potential appearing at the input terminal in the normal, or first, reception state is decreased.

In accordance with another feature of the present invention, a low-pass filter circuit is provided in which a response rate is increased for a change of the output voltage appearing at the output terminal from a high voltage to a low voltage.

In accordance with a further feature of the present invention, a low-pass filter circuit is provided in which a response rate is increased for a change of the output potential appearing at the output terminal from a low voltage to a high voltage and from a high voltage to a low voltage.

Briefly described, the inventive low-pass filter circuit comprises a low-pass filter coupled between an input terminal and an input of a phase inverting and amplifying circuit, the low-pass filter including a series connection of first and second resistors and a capacitor, the first resistor being shunted by a diode. In an embodiment of the invention, the inverting and amplifying circuit is shunted by a feedback circuit having a predetermined time constant.

In a preferred embodiment of the present invention, the diode is connected such that the cathode of the diode is connected to the input terminal side, so that the feedback circuit may be more quickly discharged. Typically, while the diode is cut off when the output voltage of the phase inverting and amplifying circuit is low, referred to as a first operating state, the diode is turned on on the occasion of transition of the output of the phase inverting and amplifying circuit from a low voltage to a high voltage. Preferably, the time constant of the feedback circuit is selected such that a ripple in an output voltage from the phase inverting and amplifying circuit in the first operating state may be decreased.

Alternatively, the diode is connected such that the anode of the diode may be connected to the input terminal side, so that the feedback circuit is more quickly charged thereby. As a result, the diode is turned off on the occasion of the first operating state, while the diode is and on on the occasion of transition of the output from the phase inverting and amplifying circuit from a high voltage to a low voltage.

In another preferred embodiment, the diode may comprise a first diode with the cathode thereof connected to the input terminal side, so that the time constant feedback circuit may be discharged, and a second diode with the anode thereof connected to the input terminal side, so that the time constant circuit. As a result, the previously described two features may be employed simultaneously.

Thus, in accordance with the present invention, a low-pass filter circuit is provided in which a response rate of a change in the output voltage in either direction or both directions can be increased while a ripple in the output voltage in a the normal (or first) reception state (when the voltage output by the lowpass filter is substantially constant) can be decreased by decreasing the time constant of the feedback circuit.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
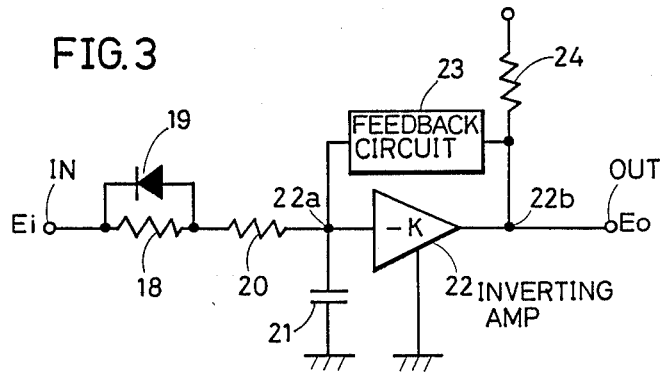
FIG. 3 is a schematic diagram of one embodiment of the inventive low-pass filter circuit.

FIG. 3 is a schematic diagram of one embodiment of the inventive low-pass filter circuit. Referring to FIG. 3, a series connection of a first resistor 18 and a second resistor 20 is connected between an input terminal IN and a input 22a of a phase inverting amplifier 22. A capacitor 21 is connected between the input 22a of the phase inverting amplifier 22 and the ground. It is to be noted that the series connected resistors 18 and 20 and the capacitor 21 constitute a low-pass filter. In accordance with the embodiment shown in FIG. 3, the first resistor 18 is shunted by a diode 19, so that the cathode of the diode 19 may be connected to the input terminal IN. The phase inverting amplifier 22 may comprise a phase inverting amplifier operable to be switchable and having a high input impedance, having the input 22a connected to the above described series connection and the capacitor 21 and the output 22b connected to the output terminal OUT. The phase inverting amplifier 22 is shunted by a feedback circuit 23 having a predetermined time constant selected to decrease a ripple in the output voltage Eo in the normal, or first, reception state wherein the output of the phase inverting amplifier is substantially constant. A load resistor 24 is also connected to the output of the phase inverting amplifier 22. The input voltage is denoted as Ei and the output voltage is denoted as Eo.

With reference to the diagram shown in FIG. 3, it is pointed out that since the diode 19 is connected in parallel with the first resistor 18 constituting the low-pass filter to be connected to the input of the phase inverting amplifier 22, whereby a discharging circuit of a smaller time constant is formed, the electric charge in the feedback circuit 23 can be quickly discharged through the diode 19. Accordingly, although the time constant of the feedback circuit 23 is selected such that the ripple in the output voltage Eo at the output terminal OUT is decreased, a response rate in a change of the output voltage Eo in an inceasing direction can be increased. Meanwhile, since the voltages at both ends of the first resistor 18 are approximately equal on the occasion of the normal, or first reception state defined above, the diode 19 is turned off, with the result that the diode 19 does not exert any adverse influence upon the low-pass filter circuit on the occasion of said normal reception state, i.e. on the occasion of a state wherein the output voltage Eo appearing at the output terminal OUT is maintained constant.

Figure 4:
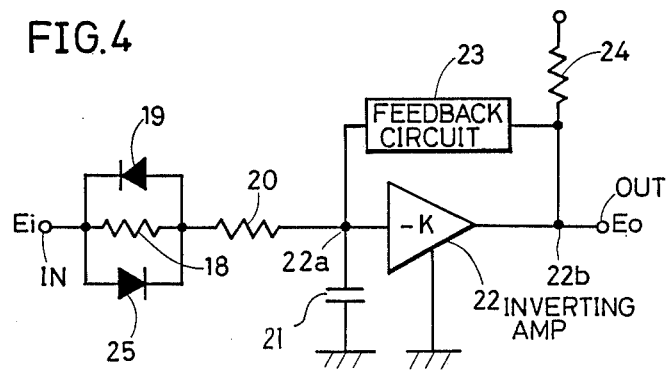
FIG. 4 is a schematic diagram of another embodiment of the inventive low-pass filter circuit.

FIG. 4 is a schematic diagram of another embodiment of the inventive low-pass filter circuit. A different point of the embodiment shown in FIG. 4 as compared with the embodiment shown in FIG. 3 is that a second diode 25 is further connected in parallel with the first resistor 18 and the first diode 19, such that the polarity of the diode 25 may be opposite to that of the first diode 19, so that the electric charge of the feedback circuit 23 may be discharged by the first diode 19 while the electric charge may be charged to the feedback circuit 23 by the second diode 25. Since the remaining portions in the embodiment shown in FIG. 4 are substantially the same as those in the embodiment shown in FIG. 3, it is not believed necessary to repeat the description of the same.

It is pointed out that in the embodiment shown in FIG. 4 the time constant of the feedback circuit 23 is selected so that the ripple in the output voltage Eo on the occasion of said first reception state with substantially constant output voltage may be small. Since the voltages at both ends of the first resistor 18 at the time are substantially equal to each other, both diodes 19 and 25 are turned off and then the low-pass filter circuit per se operates as if these diodes 19 and 25 had been removed. This means that these dioes do not adversely affect the low-pass filter circuit.

Figure 1:
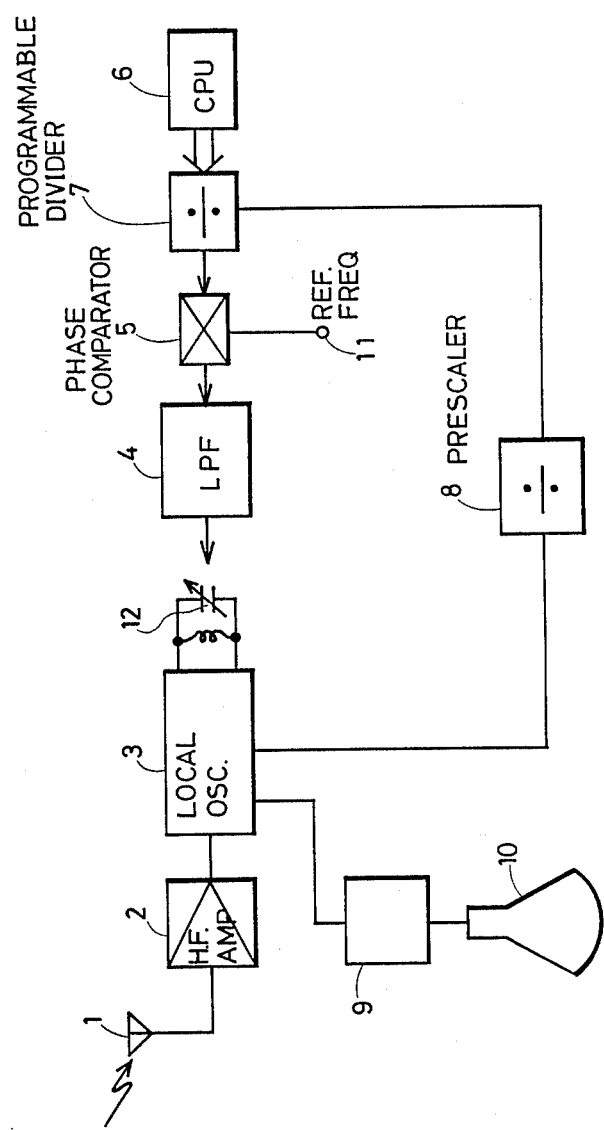
FIG. 1 is a block diagram of a system for controlling a tuning apparatus employing a phase locked loop.

Now let it be assumed that a pulse for causing a change in the output voltage Eo is applied to the input terminal IN from the phase comparator 5 shown in FIG. 1. As a result, in case where a change is about to occur in the output voltage Eo from a high voltage to a low voltage, the second diode 25 is biased in a forward direction, so that the same is turned on, with the result that the electric charge is quickly fed to the feedback circuit 23. On the other hand, in case where a change is about to occur in the output voltage Eo from a low voltage to a high voltage, the first diode 19 is biased in a forward direction so that the same is turned on, with the result that the electric charge is quickly discharged from the feedback circuit 23. Thus, even in case where the output voltage Eo is about to change in either direction, a ripple can be decreased and simultaneously the response rate of the output voltage Eo can be increased.

Figure 2:
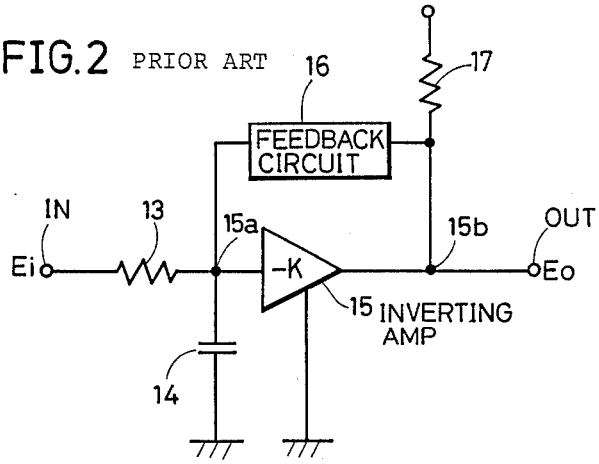
FIG. 2 is a schematic diagram of a conventional low-pass filter circuit employed in the system shown in FIG. 1.
Figure 5:
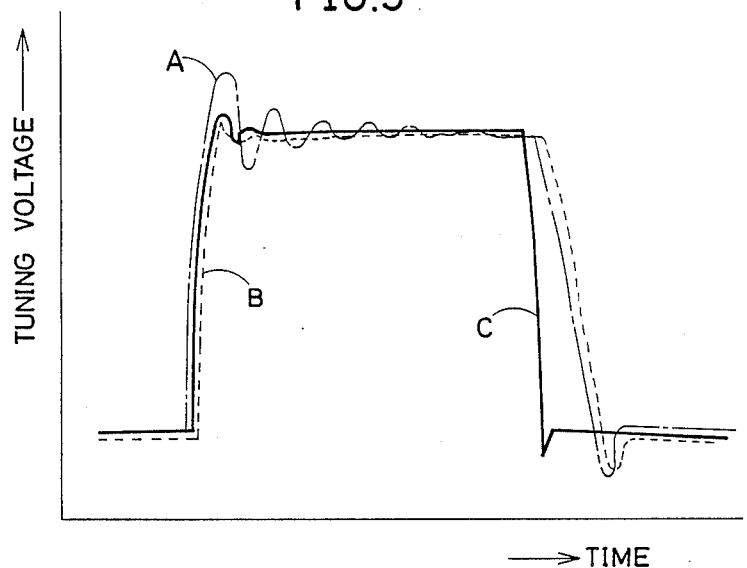
FIG. 5 is a graph showing a comparison of the response characteristic of the conventional and inventive low-pass filter circuits.

FIG. 5 is a graph showing a comparison of the response characteristics of the inventive and conventional low-pass filter circuits. Referring to FIG. 5, one dotted line curve A shows the response characteristic of the conventional low-pass filter circuit shown in FIG. 2, the dotted line curve B shows the response characteristic of one embodiment of the invention low-pass filter circuit shown in FIG. 3, and the solid line curve C shows the response characteristic of another embodiment of the inventive low-pass filter circuit shown in FIG. 4. As is appreciated from these curves in FIG. 5, the response characteristics of the embodiments of the inventive low-pass filter circuit shown in FIGS. 3 and 4 exhibit an improved response characteristic as compared with the conventional low-pass filter circuit shown in FIG. 2.

Figure 6:
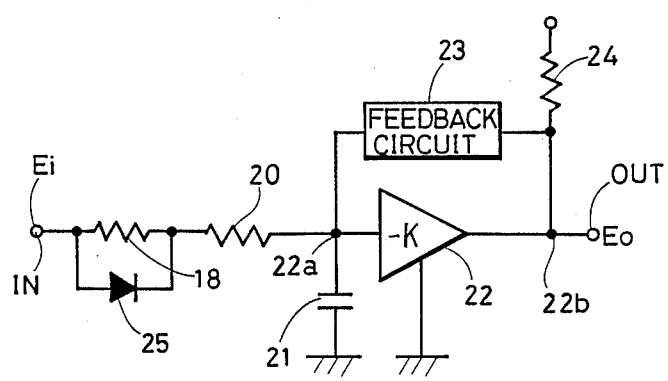
FIG. 6 is a schematic diagram of a further embodiment of the inventive low-pass filter circuit.

FIG. 6 is similar to FIG. 4 and shows a schematic diagram of a further embodiment of the inventive low-pass filter circuit. A difference of the embodiment shown in FIG. 6 from that shown in FIG. 4 is that the first diode 19 is omitted and only the second diode 25 is maintained. The embodiment shown in FIG. 6 aims to provide a low-pass filter circuit wherein a response rate is increased only in case where the output voltage Eo at the output terminal OUT is about to change from a high voltage to a low voltage, in which case provision of only the second diode 25 is sufficient.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A low-pass filter circuit, comprising:
   a low-pass filter including a series connection of first and second resistors and having one end connected to an input terminal and a capacitor connected between the other end of said series connection and a ground,
   phase inverting and amplifying circuits means having an input connected to one of said ends of said series connection and an output connected to an output terminal,
   feedback circuit means coupled between said input and output of said phase inverting and amplifying circuit means and having a predetermined time constant, and
   a diode means connected in parallel with said first resistor.

2. A low-pass filter circuit in accordance with claim 1, wherein said diode means is connected such that a cathode thereof is connected to said input terminal, for discharging electric charge stored in said feedback circuit means.

3. A low-pass filter circuit in accordance with claim 2, wherein said diode means is operable for being turned off on the occasion of a first reception state and is turned on on the occasion of a change in the output of said phase inverting and amplifying circuit means from a low voltage to a high voltage.

4. A low-pass filter circuit in accordance with claim 3, wherein the time constant of said feedback circuit means is selected such that a ripple in the output of the phase inverting and amplifying circuit means is decreased on the occasion of said first reception state.

5. A low-pass filter circuit in accordance with claim 1, wherein said diode means is connected such that an anode of said diode means is connected to the input terminal for providing electric charge to charge said feedback circuit means and such that said diode means is turned off on the occasion of a first reception state and is turned on on the occasion of a change in the output of the phase converting and amplifying circuit means from a high voltage to a low voltage.

6. A low-pass filter circuit in accordance with claim 1, wherein said diode means comprises:
   a first diode means connected in parallel with said first resistor such that a cathode of said first diode means is connected to the input terminal for discharging the electric charge of said feedback circuit, and
   a second diode means connected in parallel with said first resistor such that the anode of said first diode means is connected to the input terminal for charging the electric charge to said feedback circuit.

7. A low-pass filter circuit in accordance with claim 1, wherein
   said phase inverting and amplifying circuit means comprises a switchable type amplifier having a high input impedance.

8. A low-pass filter circuit in accordance with claim 6, wherein
   said first diode means is operable for being turned on only on the occasion of a change of the output of the phase inverting and amplifying circuit means from a low voltage to a high voltage, and
   said second diode means is operable for being turned on only on the occasion of a change of the output voltage of said phase inverting and amplifying circuit means from a high voltage to a low voltage.

9. A low-pass filter circuit in accordance with claim 8, wherein the time constant of said feedback circuit means is selected such that a ripple in the output voltage of said phase inverting and ammplifying circuit means is decreased on the occasion of a first reception state.

10. In a tuning control apparatus including a phase lock loop, the phase lock loop including a local oscillator providing a signal varying at a frequency determined by a voltage variable capacitor, a low-pass filter providing a control voltage to the voltage variable capacitor, a frequency dividing circuit for dividing the frequency of the signal provided by the local oscillator and a phase comparator for comparing the phase of the divided frequency signal with a reference and for providing a signal to the low-pass filter, the low-pass filter including a series resistor in a signal path for said signal provided by the phase comparator and a capacitor connected between the series resistor and ground, the improvement comprising:

time constant changing means for changing a time constant of the low-pass filter between plural values in response to a magnitude of the signal passing through the series resistor, said time constant changing means including a further resistor series connected with said series resistor and diode means operable for turning on in response to a voltage thereacross in excess of a predetermined value and for turning off in response to a voltage thereacross below said predetermined value, said diode means connected across said further resistor for changing said time constant of said low-pass filter between a first, high, value proportional to a sum of said series resistor and said further resistor when said voltage across said diode means is below said predetermined value and a second, low, value proportional to said series resistor when said voltage across said diode means is above said predetermined value.

11. An improved tuning control apparatus as recited in claim 10, wherein said low-pass filter includes an inverting amplifying means connected in said signal path, and feedback means connecting an output of said inverting amplifying means to an input thereof, said feedback means including means for setting a time constant thereof within a range from a first value which permits an increased rate of response to a changing signal from said phase comparator, but which passes signal ripple, to a second value which decreases signal ripple but which provides a reduced rate of response to a changing signal from said phase comparator, said time constant changing means operable for enabling the time constant of said feedback means to be set to said second value thereby to reduce signal ripple and for compensating for said reduced rate of response by reducing the time constant of said low-pass filter thereby to increase responsiveness thereof when said voltage provided by said phase comparator increases.

12. In a tuning control apparatus including a phase lock loop, the phase lock loop including a local oscillator providing a signal varying at a frequency determined by a voltage variable capacitor, a low-pass filter providing a control voltage to the voltage variable capacitor, a frequency dividing circuit for dividing the frequency of the signal provided by the local oscillator and a phase comparator for comparing the phase of the divided frequency signal with a reference and for providing a signal to the low-pass filter, the low-pass filter including a series resistor in a signal path for said signal provided by the phase comparator and a capacitor connected between the series resistor and ground, the low-pass filter further including an inverting amplifying means connected in said signal path, and feedback means connecting an output of said inverting amplifying means to an input thereof, said feedback means including means for setting a time constant thereof within a range from a low value which permits an increased rate of response to a changing signal from said phase comparator, but which passes signal ripple, to a high value which decreases signal ripple but which provides a reduced rate of response to a changing signal from said phase comparator, the improvement comprising:

compensating means for compensating for the time constant of said feedback means and for permitting setting the feedback means time constant to said high value while maintaining a high response rate to voltage signals, including:

time constant changing means for changing a time constant of the low-pass filter between plural value in response to the signal passing through the series resistor.

13. An improved tuning control apparatus as recited in claim 12 wherein:

said time constant changing means for the low-pass filter includes a further resistor series connected with said series resistor and diode means operable for turning on in response to a voltage thereacross in excess of a predetermined value and for turning off in response to a voltage thereacross below said predetermined value, said diode means connected across said further resistor for changing said time constant of said low-pass filter between a first, high, value proportional to a sum of said series resistor and said further resistor when said voltage across said diode means is below said predetermined value and a second, low, value proportional to said series resistor when said voltage across said diode means is above said predetermined value.

* * * * *